United States Patent [19]
Brosson et al.

[11] Patent Number: 6,137,814
[45] Date of Patent: Oct. 24, 2000

[54] LIGHT EMITTING DEVICE HAVING AN INTEGRATED COMPONENT INCLUDING AT LEAST ONE LASER SECTION AND AT LEAST ONE MODULATION SECTION

[75] Inventors: Philippe Brosson, Forges-les-Bains; Alexis Lestra, Orsay; Jean-Paul Hebert, Saint-Remy les Chevreuse, all of France

[73] Assignee: Alcatel, Paris, France

[21] Appl. No.: 09/186,417

[22] Filed: Nov. 5, 1998

[30] Foreign Application Priority Data

Nov. 6, 1997 [FR] France .................................. 97 13951

[51] Int. Cl.[7] ............................... H01S 3/00; H01S 5/00
[52] U.S. Cl. ................................. 372/33; 372/38; 372/50
[58] Field of Search .................. 372/33, 29, 32, 372/38, 50

[56] References Cited

U.S. PATENT DOCUMENTS 5,418,800  5/1995  Prior et al. ................................. 372/45

FOREIGN PATENT DOCUMENTS 0 671 791 A1  9/1995  European Pat. Off. .
0 712 180 A1  5/1996  European Pat. Off. .

OTHER PUBLICATIONS

P.A. Andrekson et al, Electrical Mode–Hopping Noise in External–Cavity Semiconductor Lasers and Mode–Hopping Elimination by a Nonoptical Control Loop, IEEE Journal of Quantum Electronics, vol. QE–23, No. 12, Dec. 1987, pp. 2078–2083.

*Primary Examiner*—Teresa M. Arroyo
*Assistant Examiner*—Quyen Leung
*Attorney, Agent, or Firm*—Sughrue, Mion, Zinn, Macpeak & Seas, PLLC

[57] ABSTRACT

The invention relates to a light emitter device comprising an integrated component having a laser section provided with an oscillator section designed to supply a laser wave, and a modulator section. In order to control the light frequency of the emitted modulated wave, an electronic circuit controls the current of the laser section in response to a measurement of the amplitude of the modulation of the voltage induced across the terminals of the laser section by the modulation section.

7 Claims, 4 Drawing Sheets

FIG_1
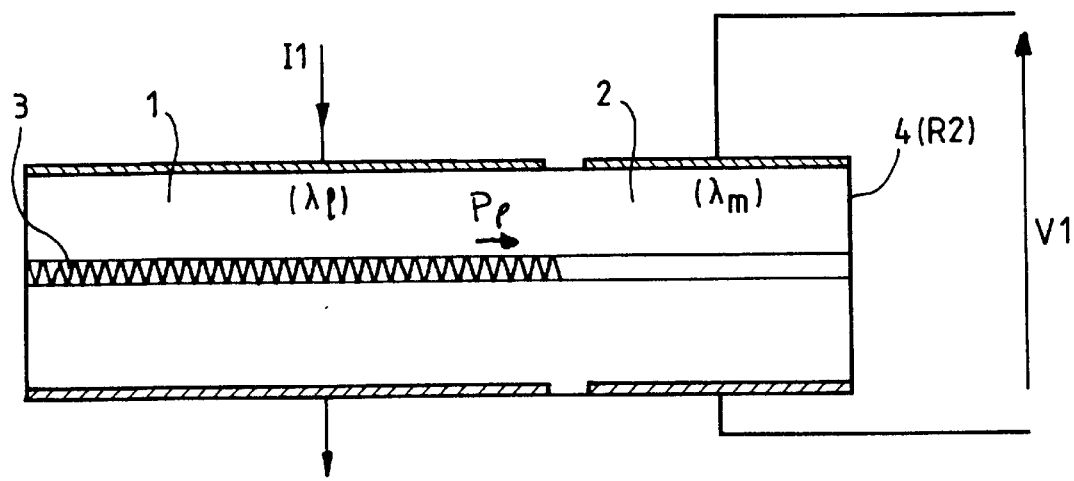
FIG_2
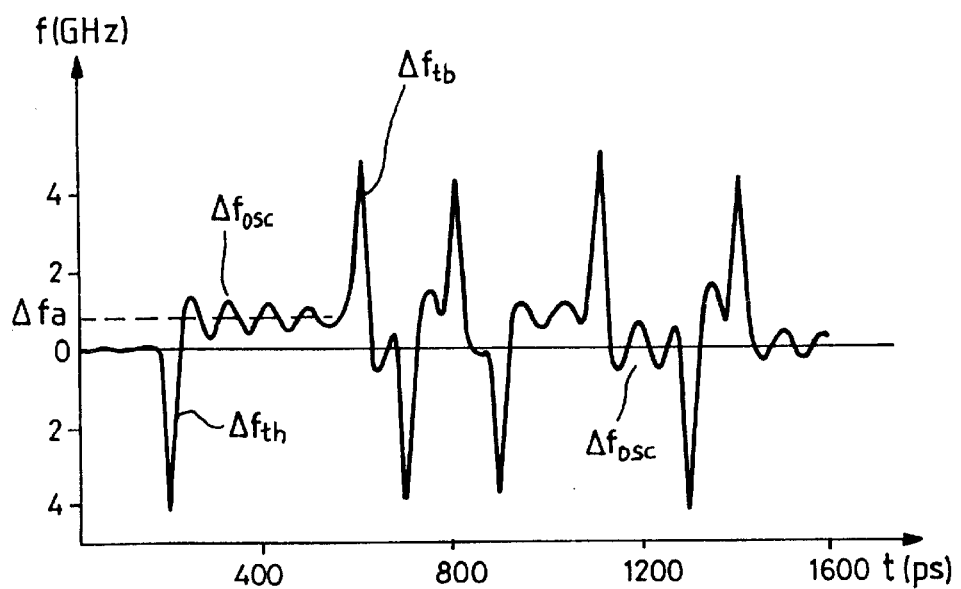

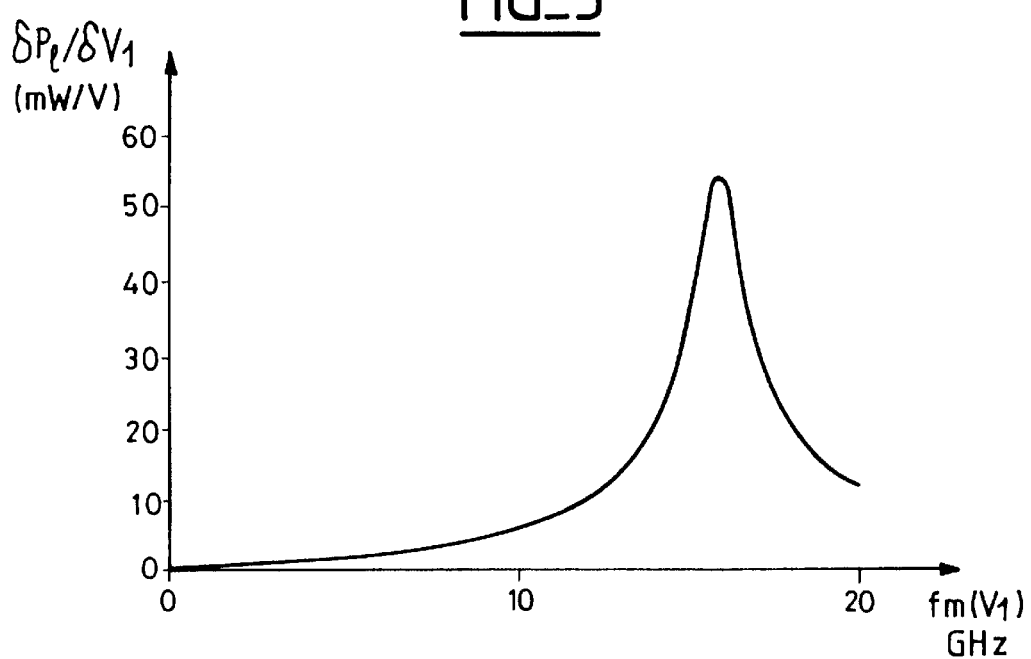
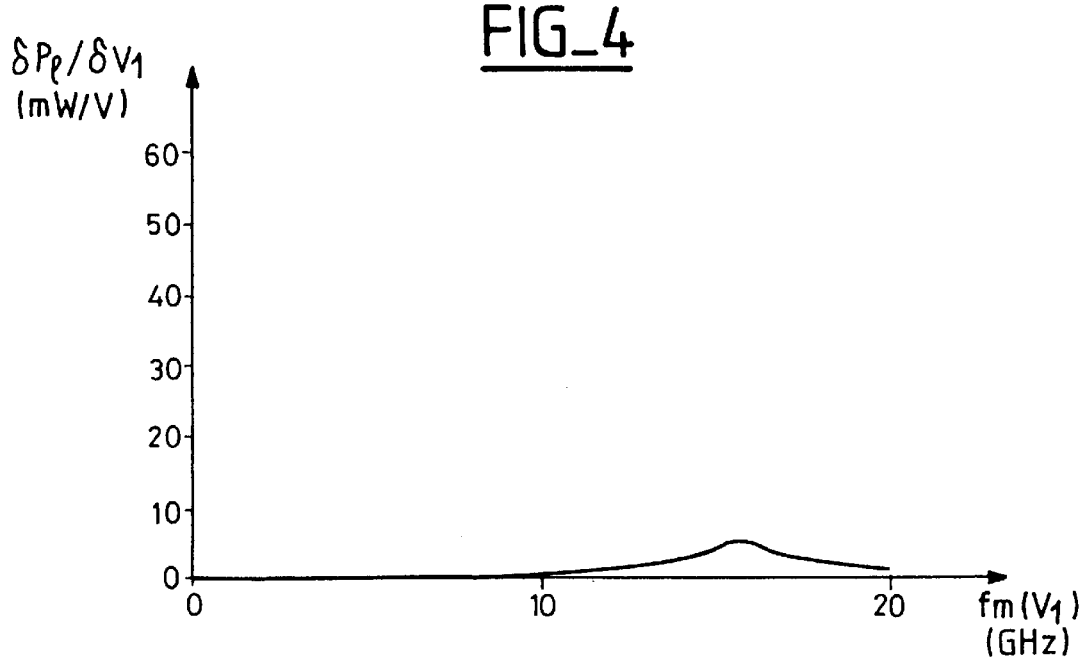

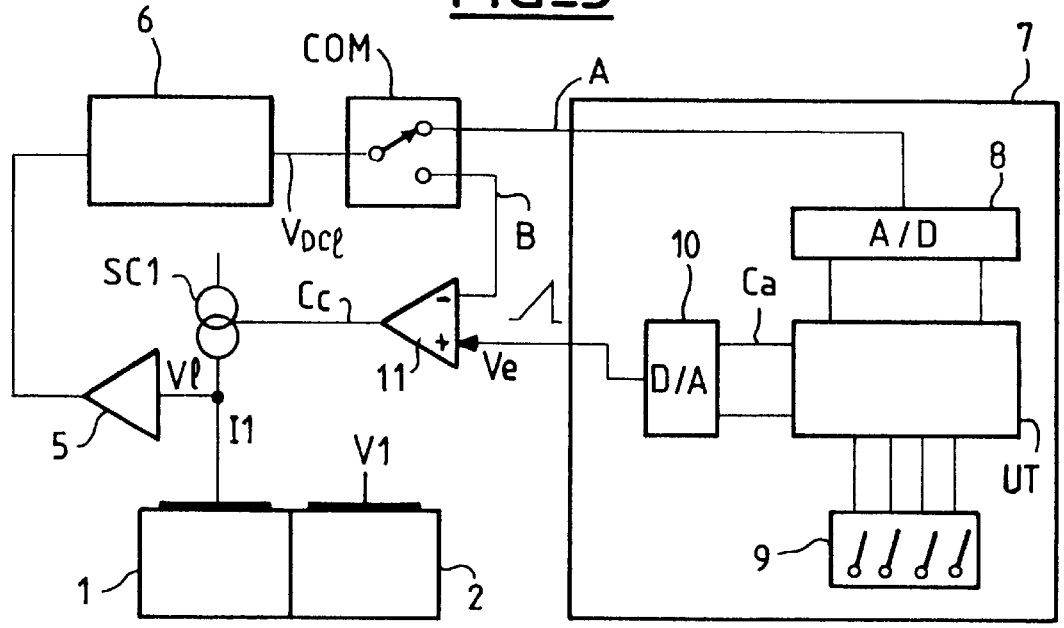
FIG_5
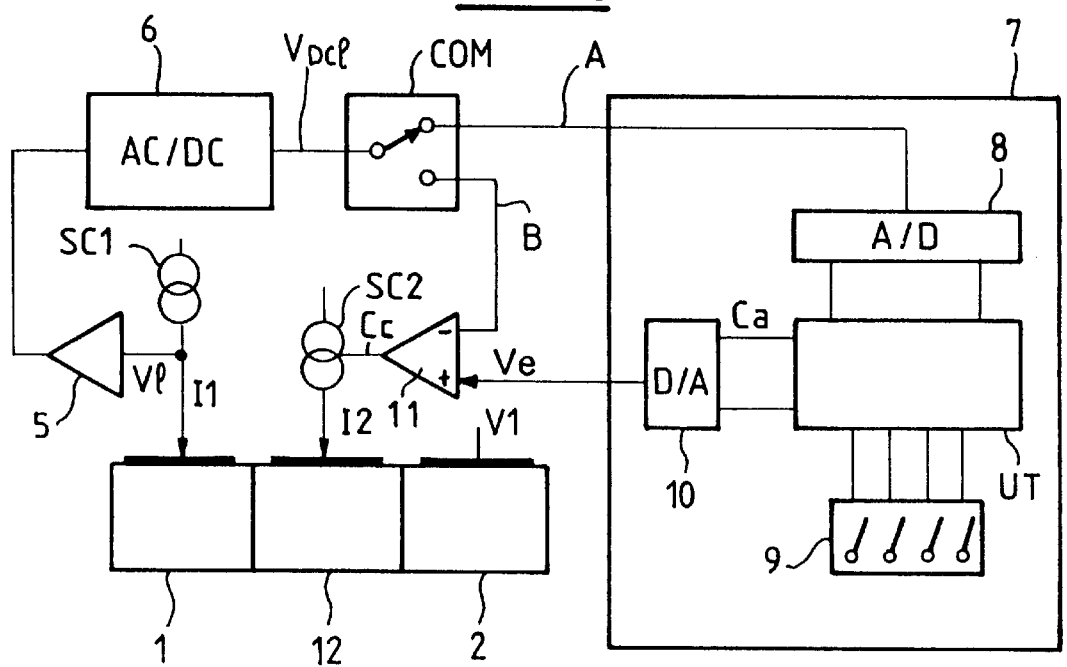
FIG_6

FIG_7
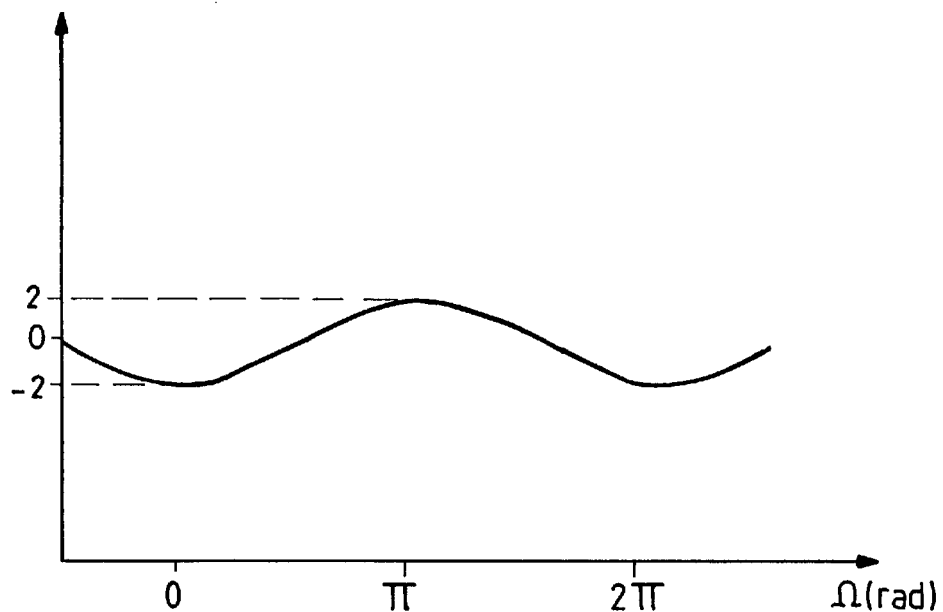
FIG_8
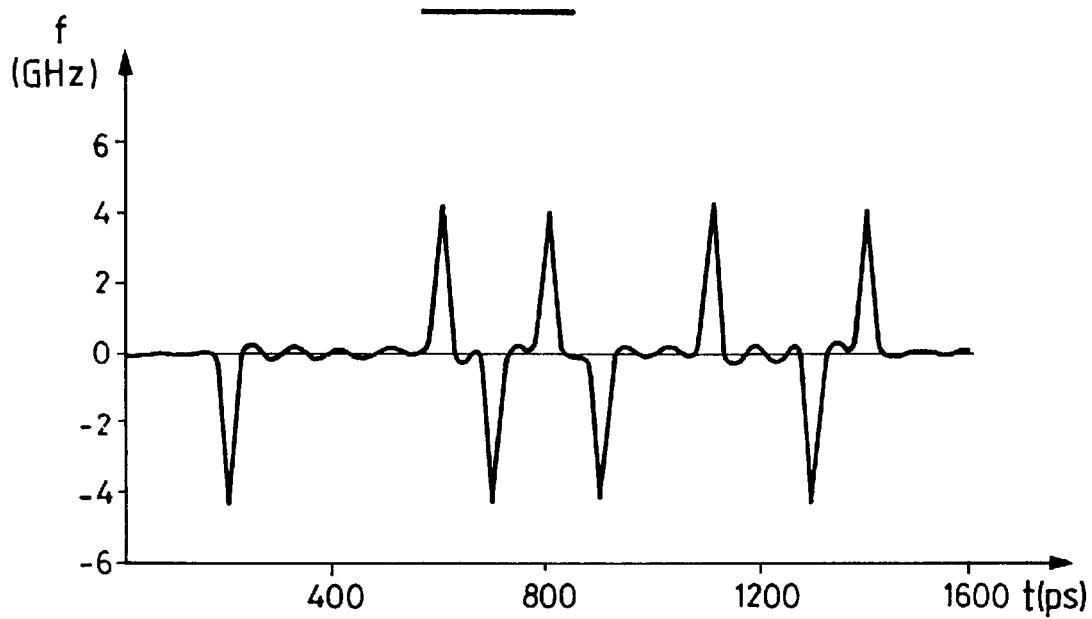

LIGHT EMITTING DEVICE HAVING AN INTEGRATED COMPONENT INCLUDING AT LEAST ONE LASER SECTION AND AT LEAST ONE MODULATION SECTION

The invention relates to a light emitting device comprising an integrated component including at least one laser section and at least one section for modulating the light power of the wave supplied by the laser section.

BACKGROUND OF THE INVENTION

In high data rate optical transmission systems, the maximum transmission distance is determined by variation in the optical frequency of the pulses output by the modulator.

In an optical transmission system using as its emitter an integrated component having a laser section and a modulator section, referred to below as an integrated laser modulator or ILM, such frequency variation has, in fact, three components: transient frequency variation, also known as transient "chirp"; adiabatic frequency variation, also known as adiabatic chirp; and oscillation, also known as oscillating chirp.

An ILM device is shown diagrammatically in FIG. 1. It is a semiconductor device having at least one laser oscillator section 1 and at least one modular section 2. The section 1 includes a distributed grating 3 known as a Bragg grating, extending along the longitudinal propagation axis and delivering to the modulator section 2 light energy of power $P_l$ at a given frequency (or at a given wavelength $\lambda_l$) selected by the distributed grating, in response to electrical current I1 being injected transversely through the laser section.

The modulator section 2 is an electro-absorbent section controlled by a modulator voltage V1 representative of a signal to be emitted. This section is treated to have a forbidden bandwidth greater than that of the laser section so that the laser wavelength $\lambda_l$ is several nanometers longer (e.g. 10 nm to 50 nm) than the wavelength $\lambda_m$ of the modulator section. Thus, the modulator section when biased by a zero level for the voltage V1 (V1=0) is transparent to the light emitted by the laser section, while it becomes completely absorbent for a voltage level that is negative. This on/off modulation is performed by the voltage signal V1 which corresponds to the stream of bits to be transmitted at the transmission frequency of the optical transmission system. Thus, a "1" bit is transmitted by applying a voltage level 0, while a "0" bit is transmitted by applying a negative voltage level. Encoded light pulses are thus obtained at the outlet face of the modulator section. The outlet face 4 of the modulator is given antireflection treatment so as to have a low reflection coefficient R2.

As mentioned above, that ILM device suffers from three types of light frequency variation.

Transient frequency variation is frequency variation on the high and low transitions of the pulses due to on/off modulation. This on/off modulation gives rise to variation in the refractive index in this section at the times of the high and low transitions. This gives rise to phase variation at the outlet face of the modulator. This is what varies the pulse frequency on the rising and falling fronts of the light pulse, accompanied in practice by a red offset or a blue offset at the outlet from the modulator section.

Adiabatic frequency variations and oscillation are due to the modulator and the laser being in an integrated structure. Although the outlet face 4 of the modulator is given antireflection treatment, it still has a reflection coefficient R2 that is not zero. Light loss in the modulator is therefore modulated. The residual modulation of this light loss gives rise to variation in carrier density in the laser section. This causes the refractive index in the laser section to vary, and so the laser wavelength $\lambda_l$ changes. The static component of this variation is the adiabatic frequency variation which consists in different frequencies at the stabilized high and low levels of a light pulse output from the modulator. The dynamic component of this variation consists in oscillations on each of the high and low levels.

These frequency variations are shown in FIG. 2. They correspond to a stream of output light pulses from the modulator section. It is possible to distinguish transition frequency variation on the rising fronts $\Delta f_{th}$ and on the falling fronts $\Delta f_{tb}$. Adiabatic frequency variation, which in the example shown has a positive amplitude $\Delta f_a$ of about one gigahertz, and oscillations $\Delta f_{osc}$ on the high and low states can also be seen. Unfortunately, these frequency variations have a direct affect on optical transmission quality. It is therefore appropriate to control frequency variations so as to optimize transmission quality, thereby making it possible to increase the distance between repeaters on optical links.

One known solution in the state of the art for controlling transient frequency variation consists in providing a third or "phase" section after the modulator section. The phase section is controlled by a voltage signal that is in phase opposition to the control signal V1 applied to the modulator section. In this way, the refractive index variation in the modulator section is compensated, thereby making it possible to eliminate or attenuate transient frequency variation. However, that solution takes no account of problems associated with reflection on the outlet face from the modulator circuit and therefore does nothing to solve problems of adiabatic frequency variation and of oscillation on the high and low levels of the light pulses. In addition, the phase section needs to be of a composition that is different from that of the other sections (wavelength different from the laser wavelength $\lambda_l$ and from the modulator wavelength $\lambda_m$), which means that additional manufacturing steps (epitaxy) are required. Furthermore, compensation solutions based on modulation by means of signals in phase opposition are always complex. Finally, modulation in the phase section gives rise to additional light losses.

Concerning adiabatic frequency variation and oscillation, it has been observed that oscillation amplitude decreases with decreasing amplitude of adiabatic frequency variation. Reducing adiabatic frequency variation therefore also reduces oscillation. Particular attention has thus been paid to adiabatic frequency variation. Adiabatic frequency variation varies with the value of the phase $\Omega$ of the wave on the outlet face of the modulator section. The value of the phase is itself a function of the position of the grating relative to the outlet face. Thus, the value of adiabatic frequency variation in an ILM device is itself highly random. Nevertheless, for ILM devices obtained in the same manufacturing run, a maximum amplitude for adiabatic frequency variation is known (in absolute value).

A commonly used method consists in sorting components and in retaining only those components that exhibit low adiabatic frequency variation.

To reduce adiabatic frequency variation, the outlet face of the modulator is also treated so that it is coated in antireflection materials, so as to obtain reflectivity R2 that is as small as possible. At the cost of using a complex manufacturing method, it is thus possible to achieve reflectivity R2 of about $2 \times 10^{-4}$ as compared with reflectivity of about $10^{-3}$ or $10^{-2}$ as obtained by common manufacturing methods. However, combining the methods of sorting components by performance and of drastically reducing the reflection coefficient R2 has non-negligible repercussions on manufacturing costs, and in addition greatly reduces yield.

Thus, the state of the art does not provide satisfactory solutions for reducing adiabatic frequency variation and oscillation on output light pulses.

An object of the invention is to provide a simple and effective solution to this technical problem.

Experientially, it has been found that the amplitude of adiabatic frequency variation is a periodic function of the phase $\Omega$ of the wave on the outlet face of the modulator. There also exists a value for the phase $\Omega$ at which the amplitude of adiabatic frequency variation is zero (or equal to a given value). In the invention, a technical solution has thus been sought making it possible to determine the phase value $\Omega$ at which adiabatic frequency variation has the desired value and enabling action to be taken on the ILM device so as to obtain said phase value.

It is observed that the light power $P_l$ and the voltage of the laser section are modulated by the controlling voltage modulation V1 applied to the modulator section. Numerical simulation of the modulation of the power $\delta P_l/\delta V1$ by modulation of the voltage V1 shows that when the phase $\Omega$ is adjusted to have zero amplitude for the adiabatic frequency variation, then modulation of the laser power $P_l$ (rear face) is at a minimum. The same applies to modulation of the laser voltage $V_l$. FIGS. 3 and 4 are curves for $\delta P_l/\delta V1$. The first curve shows strong resonance for adiabatic frequency variation having positive amplitude of about 1 GHz. The second curve shows greatly reduced resonance for adiabatic frequency variation of zero amplitude.

The technical solution to the problem posed in the invention is based on this observation. By measuring the amplitude of the voltage modulation at the terminals of the laser section, it is possible to determine and adjust the phase at the outlet from the modulator section. Thus, if the amplitude of this voltage modulation is at a minimum, for example, then the corresponding amplitude in adiabatic frequency variation will be zero.

If it is desired to set the amplitude of adiabatic frequency variation at a determined value that is not zero, it is also necessary to calibrate variation in the high frequency voltage with phase variation. Given the maximum amplitude of adiabatic frequency variation for a given manufacturing run, it is possible to calibrate the laser voltage modulation curve and thus determine the phase value that needs to be obtained.

OBJECTS AND SUMMARY OF THE INVENTION

Thus, in general terms, the invention consists in modifying the refractive index in a laser section designed to produce a laser wave, and to do so in such a manner as to servo-control the phase of the wave supplied to the modulator section.

In practice, servo-control of the phase can be achieved by modifying the refractive index in the laser section by injecting a correction electric current.

The invention thus provides a light emitter device comprising an integrated component having a laser section for supplying a laser wave to a modulator section designed to receive modulation control representative of a signal to be emitted, said laser section comprising at least one oscillator section, wherein, since said modulation control induces voltage modulation across the terminals of said oscillator section, said device comprises an electronic circuit for adjusting an electric current injected into the laser section in response to measuring the amplitude of said induced modulation of voltage.

The electronic circuit is thus designed in such a manner as to avoid taking account of voltage fluctuations due to causes other than the emission modulation of the signal. In particular, its time constant must in all cases be sufficient (more than 10 ns) to avoid interference from relaxation oscillation due to spontaneous emission (phase noise).

In a first embodiment of the invention, action is taken directly on the electric current I1 injected into the oscillator section. Since the carrier density is held fixed beyond the oscillation threshold, servo-control of the refractive index in the oscillator section by the current I1 takes place by a thermal effect. This is not without consequence on light power, but it poses no problems in applications to light emitter devices having amplifiers operating under saturated conditions.

For optical transmission applications that use amplifiers under linear conditions, a second embodiment of the invention is preferred in which light power is unchanged. In this second embodiment of the invention, the laser section has a phase control section coupled to the oscillator section. The phase control section is placed between the oscillator section and the modulator section, and it is of the same structure as the modulator section (same vertical structure and same compositions for the semiconductor layers). This phase control section is current controlled by the electronic control circuit to modify its refractive index by modifying carrier density. Phase is thus servo-controlled without a thermal effect, by providing a phase control section. Since the phase control section is of the same structure as the modulator section, there are no additional method steps. It merely suffices to provide an additional electrode when designing the mask for defining the electrodes.

By modifying the refractive index in the laser section, the value of the wavelength $\lambda_l$ in this section is slightly altered. However in practice this variation is of the order of 1 nanometer and has no consequence on the 10 nm to 30 nm difference that is necessary between the wavelengths $\lambda_l$ and $\lambda_m$ in order to ensure that the modulator section is transparent for the laser emission.

BRIEF DESCRIPTION OF THE DRAWINGS

Other features and advantages of the invention appear on reading the description given by way of non-limiting illustration and made with reference to the accompanying drawings, in which:

FIG. 1, described above, is a diagram of a structure for a prior art integrated ILM device;

FIG. 2 shows the three types of frequency variation in a light pulse output from the modulator section;

FIGS. 3 and 4 are curves showing small signal modulation of laser power (rear face) as a function of the modulation frequency of the modulator section;

FIG. 5 shows a first embodiment of the invention;

FIG. 6 shows a second embodiment of the invention;

FIG. 7 is a curve showing the amplitude of adiabatic frequency variation as a function of outlet phase; and FIG. 8 shows the waveform of a light pulse stream obtained by the invention with adiabatic frequency variation brought to a zero value.

MORE DETAILED DESCRIPTION

Throughout the remainder of the description, the same references are used for designating the same elements.

FIG. 5 shows a first embodiment of the invention. The ILM device has a first section designed to provide a laser wave and a second section 2 for modulation. In this first embodiment of the invention, the first section is constituted solely by an oscillator section 1. A DC source SC1 injects an electric current I1 transversely through the laser section 1. Modulator means (not shown) apply a voltage V1 to the terminals of the modulation section 2 which is reverse-biased and on/off modulated. Means for measuring the modulation amplitude of the voltage $V_l$ at the terminals of the oscillator section comprise a high frequency amplifier 5 and an AC-DC voltage converter 6.

The high frequency voltage amplifier 5 receives at its input the voltage $V_l$ taken across the terminals of the oscillator section 1 and at its output it delivers the AC component of this voltage. It is followed by an AC-DC voltage converter 6 which supplies a DC voltage $V_{DCl}$ at a level which corresponds to the amplitude of the AC component of the voltage $V_l$ and which thus constitutes a measure of the modulation amplitude of said voltage $V_l$.

As mentioned above, the converter 6 has a passband that is adapted both to measure the modulation of the signal and to filter out fluctuations due to spontaneous emission such that the time constant of the regulation loop is in any event greater than about 10 ns, but given the phenomenon which is to be corrected, it may be selected to be much greater than that.

This DC voltage $V_{DCl}$ is applied to the input of a switch COM having two outlets. A first outlet A constitutes a measurement input for a circuit 7 for servo-controlling the phase Ω of the ILM device. This servo-control circuit 7 outputs a servo-control analog voltage level Ve which is applied to a non-inverting input (+) of a differential amplifier 11.

The second outlet B is applied to the inverting input (−) of the differential amplifier 11. The output of the differential amplifier provides a control for varying the current $C_c$ which is applied to the DC current source SC1 for the purpose of adjusting the value of the electric current I1.

The servo-control circuit 7 has a processor unit UT which receives the digital value of the voltage $V_{DCl}$ from an analog-to-digital converter 8. A data register 9, e.g. configurable by means of switches, is preferably associated with the processor unit.

The processor unit delivers its digital servo-control setting $C_a$ to a digital-to-analog converter 10 whose output delivers the analog voltage setting Ve which is applied to the non-inverting input of the differential amplifier 11.

The control circuit of the ILM device operates in two modes, a calibration mode and an automatic mode.

The first mode of operation is a calibration mode which consists in the processor unit measuring the curve for amplitude of voltage modulation across the terminals of the laser section as a function of the DC electric current I1. For this purpose, this current is caused to vary between two extreme values, so as to scan through the curve shown in FIG. 7. In this mode, it is the outlet A from the switch that is selected. The differential amplifier receives only the setting analog voltage Ve as a function of the setting $C_a$.

Once this curve has been obtained, the processor unit determines the value of the servo-control digital setting $C_a$ at which there is zero amplitude for the modulation of the voltage. The circuit can then switch to automatic mode. In this mode, it is the outlet B which is enabled. The processor unit applies the determined servo-control setting $C_a$. The feedback loop including the differential amplifier 11 is operational: the value of the current I1 is continuously adjusted by the real time monitoring of the modulation amplitude of the laser voltage. In practice, the amount of current variation required is of the order of 50 milliamps to 100 milliamps.

In certain applications, it may be advantageous to select an adiabatic frequency variation amplitude that is other than zero. In calibration mode, the data register 9 is then used for programming the maximum amplitude (peak amplitude) for the adiabatic frequency variation of the ILM device, e.g. 2 GHz. As mentioned above, this value is known for a given manufacturing run. By way of illustration, FIG. 7 shows a curve giving the amplitude of adiabatic frequency variation with phase Ω. In this example, the maximum amplitude is 2 GHz. This maximum value is also equal to 2 GHz for all of the ILM devices from the same manufacturing run.

Since the variation of voltage modulation with phase follows the same periodic variation between 0 and $2\pi$ as does the amplitude of adiabatic frequency variation with phase, the processor unit can calibrate the measured curve by causing the maximum variation of voltage modulation to correspond to the maximum amplitude of adiabatic frequency variation.

In automatic mode, it is then possible to program the desired amplitude of adiabatic frequency variation in the data register, e.g. 0 GHz, 0.5 GHz, or 1 GHz. The processor unit can then use its calibrated curve to determine the digital servo-control setting $C_a$ that is to be applied.

It has been seen that this embodiment of the invention is advantageous in practice only in applications to light emission that use optical amplifiers under saturated conditions. Servo-controlling phase by means of injection current I1 operates by a thermal effect in the laser section, thus causing the light power to vary.

Another embodiment leaves this power invariant. In this second embodiment, which is shown in FIG. 6, the laser section of the ILM device for supplying a laser wave has a phase control section 12 coupled to the oscillator 1. This phase control section 12 is of the same structure as the modulator section 2 and it is placed between the laser section 1 and the modulator section 2. A DC source SC2 injects a forward-biased transverse current I2 into the phase control section 12, thereby enabling the carrier density in this section to be modified. In this embodiment, it is the current source SC2 which is controlled by the output $C_c$ of the differential amplifier 11.

This second embodiment of the invention does indeed require an additional section. However since the structure of this section is identical to the structure of the modulator section, no additional steps are required in the manufacturing processs.

Phase servo-control in accordance with the invention makes it possible to reduce or eliminate adiabatic frequency variation and oscillation, as shown in FIG. 8 for adiabatic frequency variation of zero amplitude. Nevertheless, this servo-control has no effect on transient frequency variation. Circuits for correcting transient frequency variation can therefore advantageously be combined with the emitter device of the invention.

What is claimed is:

1. A light emitter device comprising an integrated component having a laser section for supplying a laser wave to a modulator section designed to receive modulation control representative of a signal to be emitted, said laser section comprising at least one oscillator section, wherein, since said modulation control induces voltage modulation across the terminals of said oscillator section, said device comprises an electronic circuit for adjusting an electric current injected into the laser section in response to measuring the amplitude of said induced modulation of voltage.

2. A light emitter device according to claim 1, wherein said adjusted current is supplied by a DC current source applying a transverse electric current to said oscillator section.

3. A light emitter device according to claim 1, wherein said laser section comprises a phase control section placed between the oscillator section and the modulator section, said phase control section being of the same structure as the modulator section, and wherein said adjusted current is supplied by a DC current source applying a transverse electric current to said phase control section.

4. A light emitter device according to claim 2, wherein the electronic control circuit includes means for measuring the amplitude of the modulation of the voltage across the terminals of the oscillator section and a differential amplifier receiving a servo-control set voltage on a non-inverting input and said measured amplitude of the modulation on an inverting input, said amplifier outputting a current-varying control signal.

5. A light emitter device according to claim 4, wherein the electronic control circuit comprises a servo-control circuit comprising a processor unit suitable for outputting said servo-control set voltage and for measuring the amplitude modulation of the voltage across the terminals of the oscillator section, a switch being provided selectively to apply said measurement of the modulation amplitude to a first outlet leading to said. processor unit in a calibration mode.

6. A light emitter device according to claim 5, wherein the servo-control circuit includes a configurable data register for supplying the maximum value for the amplitude of adiabatic frequency variation of the integrated component, in calibration mode.

7. An emitter device according to claim 6, wherein, in an automatic mode, the amplitude measurement is applied to the inverting input of the differential amplifier via a second outlet of the switch, the data register then containing the value desired for the amplitude of adiabatic frequency variation.

* * * * *